United States Patent [19]
Yamashita et al.

[11] Patent Number: 5,343,061
[45] Date of Patent: Aug. 30, 1994

[54] SOLID-STATE IMAGING DEVICE SUPPRESSING DARK-CURRENT NOISE

[75] Inventors: Hirofumi Yamashita, Kawasaki; Yoshiyuki Matsunaga, Kamakura, both of Japan

[73] Assignee: Kabushiki Kaisha Toshiba, Kawasaki, Japan

[21] Appl. No.: 67,966

[22] Filed: May 27, 1993

[30] Foreign Application Priority Data

May 27, 1992 [JP] Japan .................................. 4-135187

[51] Int. Cl.⁵ ..................... H01L 29/78; H01L 27/14; H01L 31/00
[52] U.S. Cl. .................... 257/229; 257/223; 257/232; 257/249; 257/250; 348/243; 348/298; 348/313
[58] Field of Search ...................... 358/213.15, 213.16, 358/213.23, 213.26, 213.29, 213.31; 257/223, 229, 232, 249, 250

[56] References Cited

U.S. PATENT DOCUMENTS

| 4,851,887 | 7/1989 | Hagiwara ........................... 257/223 |
| 4,912,560 | 3/1990 | Osawa et al. . | |

FOREIGN PATENT DOCUMENTS

| 59-202777 | 11/1984 | Japan .............................. 358/213.15 |
| 1-33963 | 2/1989 | Japan .............................. 358/213.15 |

OTHER PUBLICATIONS

T. Baji, et al., Institute of Television Engineers of Japan Technical Report, vol. 3, No. 33, ED 480, Jan. 1980, pp. 41–46, "A Solid State Imager with Chalcogenide Amorphous Thin Film".
N. Harada, et al., ISSCC Digest of Technical Papers, Feb. 1985, pp. 270–271, "A ½″ Format Two-Level CCD Imager with 492×800 Pixels".

*Primary Examiner*—Ngan V. Ngo
*Attorney, Agent, or Firm*—Oblon, Spivak, McClelland, Maier & Neustadt

[57] ABSTRACT

An FIT or IT solid-state imaging device comprising a p-type Si substrate in which n-type regions forming storage diode portions, signal read-out portions, n-type CCD channels, and p⁺-type element isolating regions are formed, a solid-state imaging element chip on the top of the substrate in which pixel electrodes are formed, a photo-conductive film stacked above the solid-state imaging element chip, and a transparent electrode formed above the photo-conductive film, wherein a drain for charge injection is further provided in or at one end of the pixel region of the substrate, the potential of the storage diode portion is set to a value almost equal to the potential of the element isolating region immediately before the accumulation of the signal charge, by injecting a specified amount of charge from the drain into the storage diode portion, and during the accumulation of the signal charge, the potential applied to the transparent electrode is set to a value higher than the potential of the storage diode portion set immediately before the accumulation of the signal charge, and the potential of the storage diode portion is made close to the potential of the element isolating layer and the substrate in the vicinity particularly in a case where the amount of incident light is small so that variations in dark current are conspicuous, by injecting holes of the carriers generated by the incident light in the photo-conductive film into the storage diode portion.

12 Claims, 6 Drawing Sheets

SOLID-STATE IMAGING DEVICE SUPPRESSING DARK-CURRENT NOISE

BACKGROUND OF THE INVENTION

1. Field of the Invention

This invention relates to a solid-state imaging device using a charge-coupled device (CCD), and more particularly to a solid-state imaging device such as a photoconductive layer overlaid solid-state image sensor.

2. Description of the Related Art

For solid-state imaging devices (e.g., CCD imagers) of double-layer structure where storage diodes, signal reading sections, and signal transferring sections are arranged in a solid-state imaging element chip, which is covered with a photo-conductive film, the opening area of the photosensitive portion through which light comes in can be made wide because of their structure, so that they provide very high sensitivity. Therefore, such solid-state imaging devices are promising as imaging elements for high-sensitivity cameras such as high definition television in the future.

One of the problems of double-layer structure solid-state devices whose photo-conductive films are layered as mentioned above is so-called dark current noise generated in the storage diode portion. The dark current noise (when the image is dark or during a dark time) produces nonuniform output values, which appear as image noise, known as fixed pattern noise (F.P.N.), on the reproduction screen during a dark time.

Figure 5A:
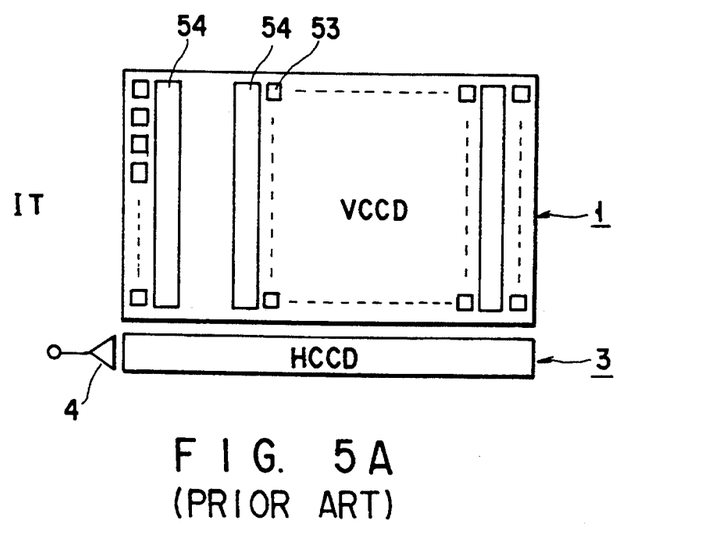
FIG. 5A is a schematic plan view of a conventional IT solid-state imaging device.
Figure 5B:
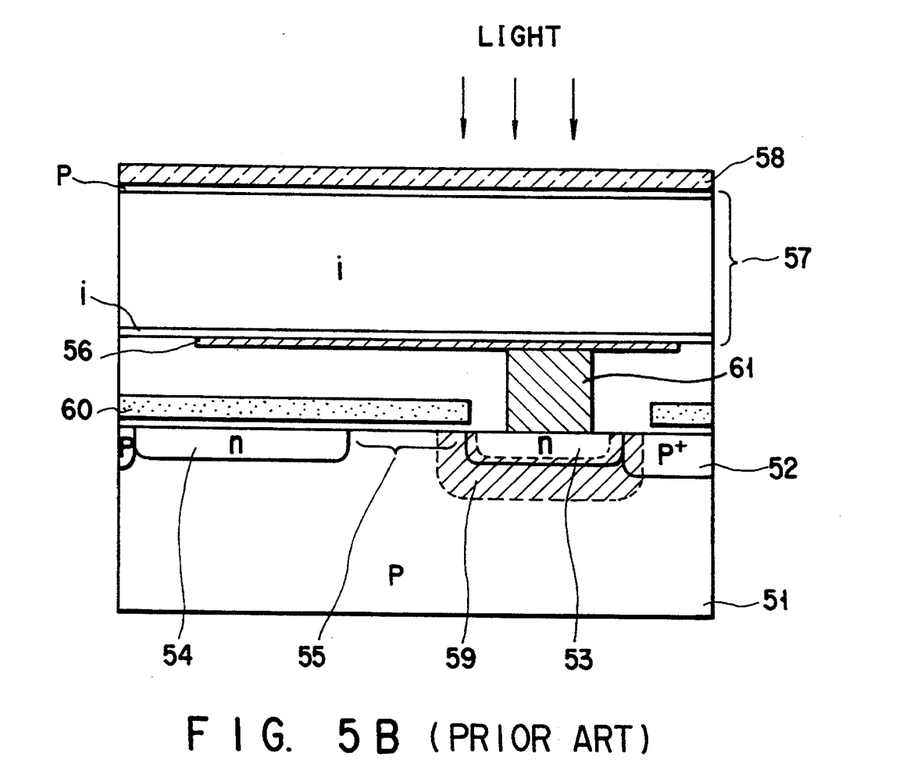
FIG. 5B is a detailed view of an unit pixel of a conventional solid-state imaging device.

FIG. 5A is a plan view of a conventional interline transfer (IT) photo-conductive layer overlaid solid-state imaging device, and FIG. 5B is a sectional view of a pixel of the imaging element. The element operates as follows. The light incident on the top surface of the element enters a photo-conductive film 57, where electron and hole pairs are generated holes pairs, thereby converting light into electricity. The photoconductive film 57 of three-layer structure is composed of an intrinsic-type (i.e., i-type) amorphous silicon (a-Si) film on a pixel electrode 56, an i-type amorphous silicon (a-Si) film on the preceding film, and a p-type amorphous silicon carbide (a-SiC) on the immediately preceding film. By an electric field applied to the photo-conductive film by a transparent electrode 58 made of, for example, indium tin oxide (ITO), the signal electrons flow into a pixel electrode, and signal electrons flow via the electrode 61 into an n-type region 53, together with a p-type silicon substrate 51 constituting a storage diode. By turning on a read-out gate 60 also serving as a CCD transfer electrode, the signal electrons accumulated in the storage diode are read via a signal read-out reading portion 55 into an n-type region 54 constituting a buried transfer channel of a vertical charge-coupled device (CCD). An element isolating region 52 of a p+-type region is also provided. As shown in FIG. 5A, columns of vertical CCDs are provided in a pixel region 1. The signal electrons read into the vertical CCD are transferred sequentially to a horizontal charge-coupled device 3 provided adjoining the pixel region. The signal electrons transferred to the horizontal CCD are sent by the horizontal CCD to a signal sensing section 4 placed at one end of the horizontal CCD.

In general, dark current flowing into the n-type region 53 forming the storage diode is mainly generated in a depletion layer 59 between the p-type Si (silicon) substrate 51 (or the p-type well region) and the n-type region 53. Especially, in a place where the edge of the n-type impurity diffused region forming the storage diode comes into contact with the p-type Si substrate surface, the depletion layer 59 always exists at the interface of the Si substrate. At the depleted substrate surface, dark current is liable to occur. The value of the dark current tends to vary from pixel to pixel. Because of this, dark current generated in the depletion layer 59 has been a main cause of fixed pattern noise (F.P.N) reproduced images. Fixed Pattern Noise is distinctively found when the image of the subject is dark, namely the amount or the incident light is small. The factors that generate dark current and its effect will be explained in detail.

Conventionally, the potential of the p-type Si substrate 51 and the element isolating region 52 is 0 V, whereas the potential of the n-type region 53 during the accumulation of the signal charge ranges from approximately 10 V to 2 V. The reason why the potential of the n-type region 53 is in the range of approximately 10 V to 2 V is as follows.

Immediately after the signal charge has been read from the n-type region 53 into the vertical CCD channel 54, the potential of the n-type region 53 of the storage diode is determined by the potential applied to the read-out gate 60. Normally, the value is approximately 10 V. After the reading of the signal charge, when the accumulation of the signal is begun, the potential of the n-type region 53 of the storage diode decreases as the amount of signal charges accumulated increases. Finally, it is saturated at the potential applied to the transparent electrode 58. Normally, approximately 2 V is applied to the transparent electrode 58. For this reason, the potential of the n-type region 53 forming the storage diode is set in the range from 10 V to 2 V.

Figure 6A:
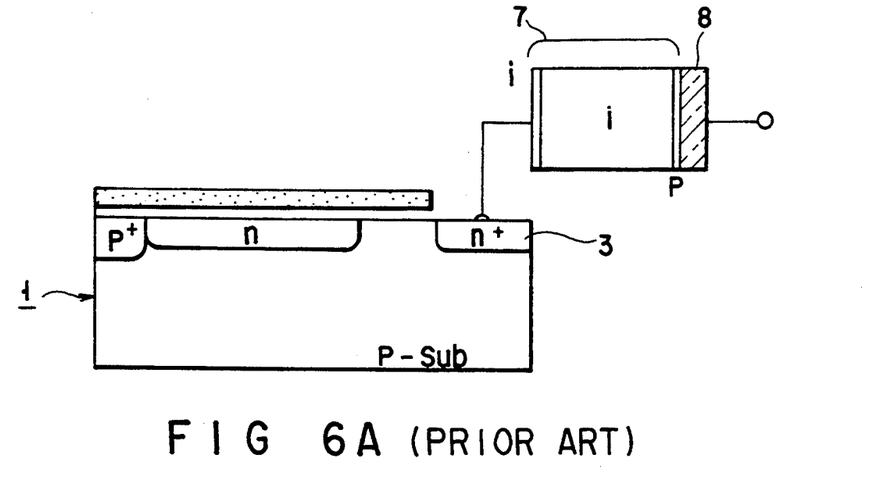
FIG. 6A is a schematic sectional view of an unit pixel of a conventional element.
Figure 6B:
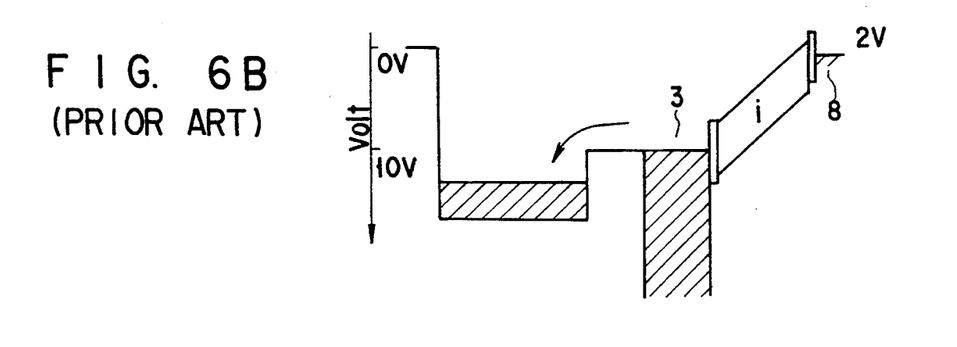
FIGS. 6B through 6D are potential diagrams for explaining the operation of the element and the potential of the storage diode.
Figure 6C:
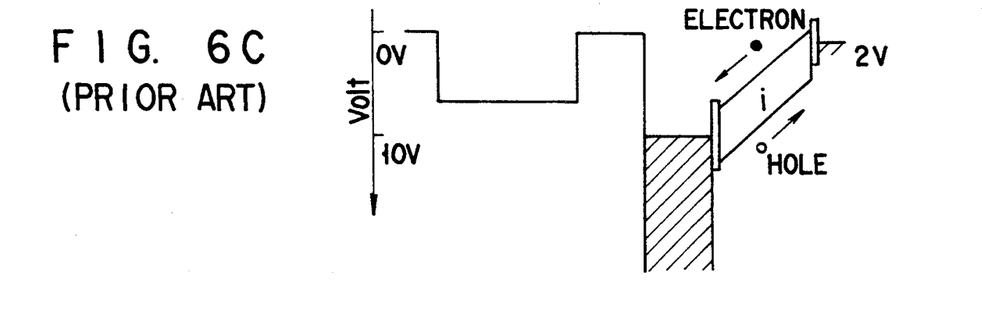
Figure 6D:
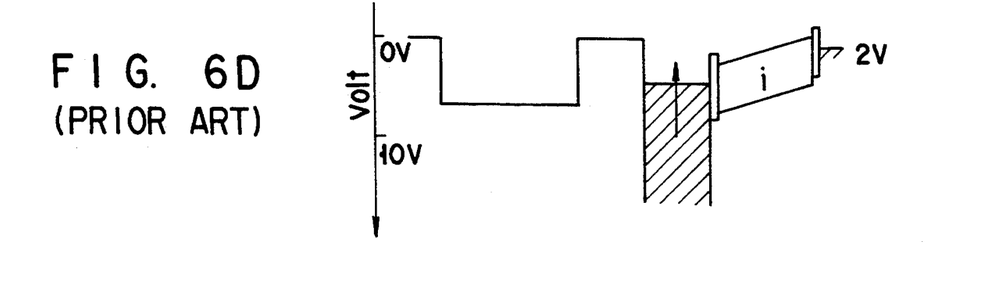

For further detailed explanation, FIG. 6A shows the construction of a conventional element, and FIGS. 6B through 6D show the relationship between the operation of the element and the potential of the n-type region 53 of the storage diode using potential diagrams accompanied by band diagrams. Specifically, FIG. 6B illustrates the potential during the reading of the signal charge into the vertical CCD channel and the state of charge. At this time, the potential of the transparent electrode 58 is approximately 2 V. The potential of the n-type region forming the storage diode is higher than this potential. In this state, the photo-conductive film junction of three-layer structure is in the reverse-biased state.

Figure 7A:
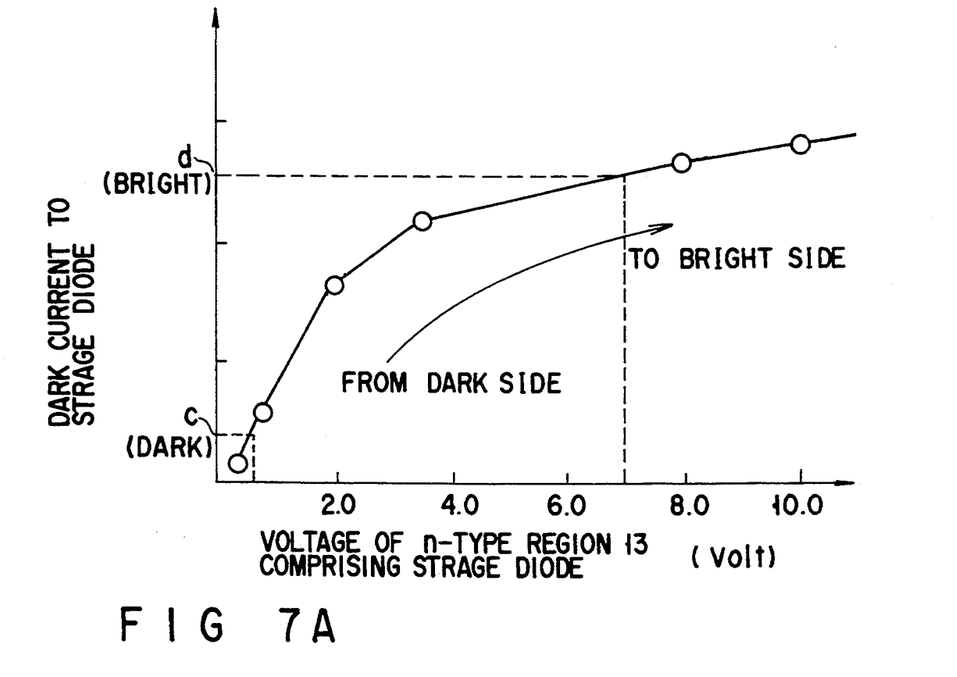
FIG. 7A is a graph showing the relationship between the potential of the storage diode in the solid-state imaging device of the present invention and the dark current flowing therein.
Figure 7B:
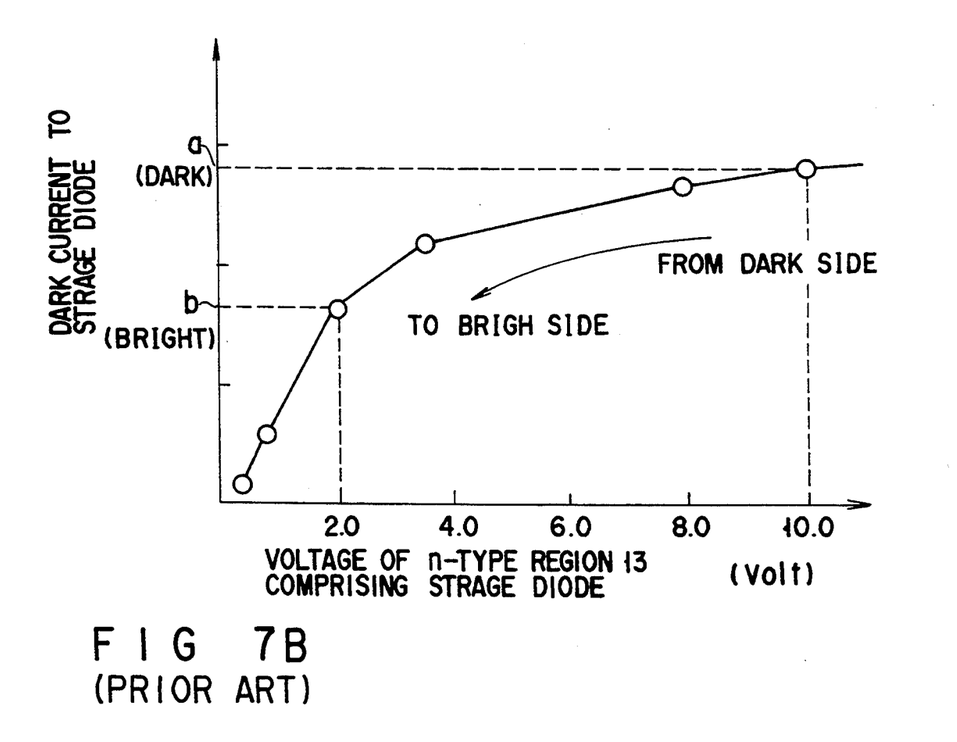
FIG. 7B is a graph showing the relationship between the potential of the n-type region forming the storage diode in the conventional solid-state imaging device and the dark current flowing therein.

FIG. 6C depicts the potential diagram during the accumulation of the signal charge and the state of charge, and FIG. 6D depicts the potential diagram at the end of the accumulation of the signal charge, immediately before reading, and the state of charge. Generally, the value of dark current generated in the depletion layer 59 around the n-type region 53 forming the storage diode becomes larger in proportion to the width of the depletion layer 59. The width of the portion in which the depletion layer develops becomes greater as the potential of the n-type region of the storage diode becomes higher. That is, as shown by a graph of actual measurements in FIG. 7B, it is found that, for example, the potential of the n-type region 53 of the storage diode is proportional to the dark current flowing into the n-type region 53.

As described above, the potential of the n-type region 53 forming the storage diode is as high as approximately 10 V when the amount of the incident light is small (i.e., when the amount of the signal charge accumulated is small), so that the width of the depletion layer around the n-type region 53 is also greater. As a result, the value of dark current generated in the vicinity is also greater (cf. value a). On the other hand, when variations in the dark current is less conspicuous or when the amount of the signal charge is great, the potential of the n-type region 53 is small. As a result, the depletion layer around the n-type region 53 forming the storage diode becomes narrower. Consequently, the value of dark current generated in the vicinity becomes smaller (cf. value b). From what has been explained, it can be understood that when variations in the dark current is conspicuous on the reproduced images, the amount of incident light is small (i.e., the amount of the signal charge accumulated in the n-type region 53 is small).

conventionally, however, as seen from the change in the potential of the n-type region 53 constituting the storage diode and the relationship, the dark current generated has had a large value (cf. value a) for a small amount of the signal charge. That is, in a case here the amount of incident light is small so that F.P.N. is conspicuous, more variations in the dark current are liable to occur easily.

As described above, in conventional photoconductive layer overlaid solid-state imaging devices, a lot of dark current generated around the storage diode during the accumulation of the signal charge occurs especially when the amount of incident light is small. Further, during a dark time when the amount of incident light is small, F.P.N on the reproduced image is more conspicuous. Because of the aforesaid multiplier effects, solid-state imaging devices with a conventional construction and operation have chief factors that degrade the quality of the reproduce image.

SUMMARY OF THE INVENTION

The object of the present invention is to provide a solid-state imaging device that, in a case where the amount of incident light is small so that F.P.N. on the reproduction screen during a dark time is conspicuous, can decrease dark current generated around the storage diode, and consequently decrease and suppress the incidence of F.P.N. on the dark (e.g., black) screen.

To achieve this object, the present invention is constructed so that the potential of the n-type region forming of storage diode may be small (i.e., the dark current noise generated is small) in a case where the amount of incident light is small so that noise is conspicuous, and that the potential of the n-type region forming the storage diode may be high in a case where the amount of incident light is large so that the noise is insignificant. More specifically, it is constructed so that the direction in which the potential of the n-type region changes may be opposite to that of a conventional device during the accumulation of the signal.

To achieve the above operation, of the carriers generated as a result of photoelectric conversion of incident light by the photo-conductive film, holes are injected into the storage diode unlike conventional devices in which electrons have been injected. Disclosed here are the structure and operation to decrease the value of dark current generated around the storage diode when the amount of incident light is small during a dark time. A drain to inject charges into the storage diode is provided and a predetermined amount of charges are injected to reset the potential of the storage diode so that the n-type region forming the storage diode may be set to approximately 0 V. A solid-state imaging device of the present invention is characterized by injecting holes which is generated in a photoconversion layer by incident light into the storage diode unlike conventional devices where electrons have been injected.

More specifically, the foregoing object is accomplished by providing an FIT (Frame Interline Transfer) or IT (Interline Transfer) solid-state imaging device comprising a p-type Si substrate in which n-type region forming storage diodes, signal read-out portions, n-type CCD channels, and p+-type isolating regions are formed, a solid-state imaging element chip on the top of the substrate in which pixel electrodes are formed, a photo-conductive film stacked above the solid-state imaging element chip, and a transparent electrode formed above the photo-conductive film, wherein: a drain for charge injection is further provided in or at one end of the pixel region; the potential of the n-type region forming the storage diode is set to a value almost equal to the potential of the isolating region immediately before the accumulation of the signal charge, by injecting a specified amount of charge from the drain into the storage diode; and during the accumulation of the signal charge, the potential applied to the transparent electrode is set to a value higher than the potential of the n-type region forming the storage diode set immediately before the accumulation of the signal charge, and as a result of injecting holes, not electrons, of the carriers generated by the incident light in the photo-conductive film into the storage diode, the injected holes and electrons cancel out one another, thereby allowing the potential of the storage diode to change from a value close to the potential of the element isolating layer and the substrate in the vicinity to a higher potential as the signal is accumulated.

Other embodiments of the present invention are as follows:

(1) A photoelectric conversion film is made of hydrogenated amorphous silicon (a-Si:H) film, and a hole injection blocking layer made of a material whose band gap energy is greater than the a-Si:H film is formed between the a-Si:H film and the transparent electrode.

(2) The reading of the signal charge from the storage diode is done by applying a voltage only to said transparent electrode.

(3) The signal reading pulse applied to the transparent electrode during the reading of the signal charge is a triangular waveform that increases in the negative direction as time elapses.

(4) The potential of said storage diode portion set immediately before the accumulation of the signal charge is set in a range from a value equal to the potential of the isolating region to a value approximately 1.5 V higher than this potential.

In the invention, immediately after the signal charge has been read from the storage diode portion, the potential of the n-type region forming the storage diode portion is set to a potential close to the potential of the substrate and the element isolating layer, and holes of the carriers generated by the incident light in the photo-conductive film are injected into the storage diode. As a result of this operation, the potential of the n-type region forming the storage diode portion presents a value close to the potential of the element isolating layer and substrate in the vicinity in a case where the amount of incident light is small so that variations in dark current are conspicuous. In consequence, the width of the depletion layer is narrower and the dark current generated becomes smaller. Therefore, it is possible to sufficiently suppress variations in dark current during a dark time, which has been a problem.

In the opposite case, or when the amount of incident light is large (e.g., when it is bright), the amount of dark current generated is large because the potential of the storage diode becomes high. In this case, even if spots appear in a bright contrast, they are less conspicuous. That is, when the amount of incident light is large, even if there are variations in dark current in the reproduced image, they may be left out of consideration because they are generally less conspicuous.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Figure 1:
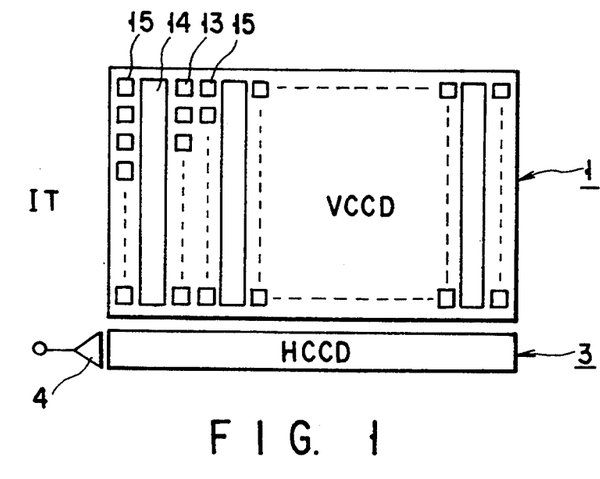
FIG. 1 is a schematic plan view of an interline transfer (IT) solid-state imaging device according to the present invention.

In a schematic plan view in FIG. 1 of a solid-state imaging device according to an embodiment of the present invention, an interline transfer (IT) device is shown.

FIG. 1 is a schematic plan view of the device. Specifically, the device is provided with a pixel region 1 containing storage diodes, signal read-out portions, and signal transferring portions (i.e., vertical CCDs) and a horizontal CCD 3, provided adjacent to the pixel region for horizontally transferring the signal charge from the pixel region (i.e. the light-receiving section). At one end of the horizontal CCD 3 is provided a sensing section 4 for supplying the signal charge transferred by the horizontal CCD 3.

Figure 2:
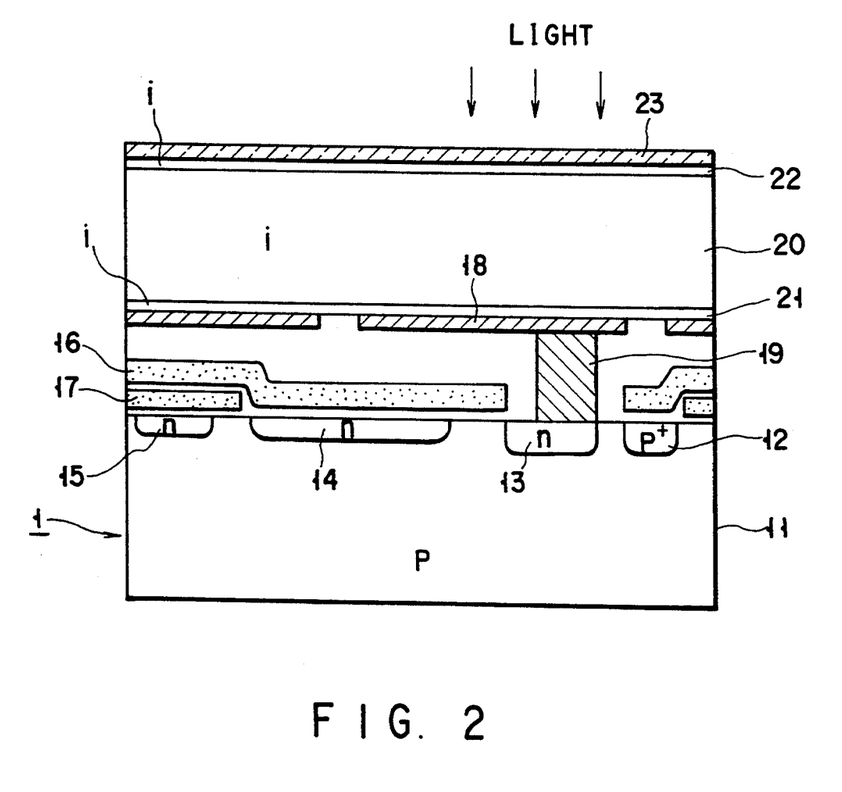
FIG. 2 is a detailed sectional view of an unit pixel in the device of FIG. 1.

In a sectional view in FIG. 2 of an unit pixel in the device, it is shown that layers of the following elements are structured. Specifically, there is provided a p-type Si substrate 11. Formed at the surface of the substrate 11 are a p+-type isolating region 12, a storage diode made up of an n-type impurity diffused region 13, a vertical CCD buried channel 14 of an n-type impurity diffused region, and a charge inject drain 15 for injecting charges into the storage diode to set the potential, as shown in the figure. On the substrate 11 provided with those elements, a signal read-out gate 16 also serving as a charge transfer electrode and a charge inject gate 17 are formed. Above them, a pixel electrode 18 is formed with an interlayer insulating film intervening. A lead electrode 19 connects the pixel electrode 18 to the n-type region forming the storage diode.

Further on the solid-state imaging element chip thus constructed, a photoelectric conversion film 20 is formed. Still further above the photoelectric conversion film, a transparent electrode 23 made of, for example, ITO (Indium Tin Oxide) is formed all over the surface with a hole injection blocking layer 22 intervening. Here, the photoelectric conversion film 20 is made of hydrogenated amorphous silicon (a-Si:H). Between the photoelectric conversion film 20 and the solid-state imaging element chip, an electron injection blocking layer 21 made of hydrogenated amorphous silicon carbide (a-SiC:H) is formed. Further, the hole injection blocking layer 22 made of hydrogenated amorphous silicon carbide (a-SiC:H) is also formed between the photoelectric conversion film 20 and the transparent electrode 23. Specifically, for example, each of the electron injection blocking layer 21, the photoelectric conversion film 20, and the hole injection blocking layer 22 is of the i type.

In this embodiment, during the accumulation of the signal charge, the potential of the transparent electrode 23 is higher than that of the element isolating region 12 and is set to approximately 7 V. As a result, holes of the carriers generated by the incident light on the photoconductive film 20 flow into the n-type region 13 forming the storage diode. Because the hole injection blocking layer 22 of, for example, a-SiC:H is on the photoconductive film, the injection of holes from the transparent electrode 23 into the photo-conductive film 20 will not take place in this state.

Figure 3A:
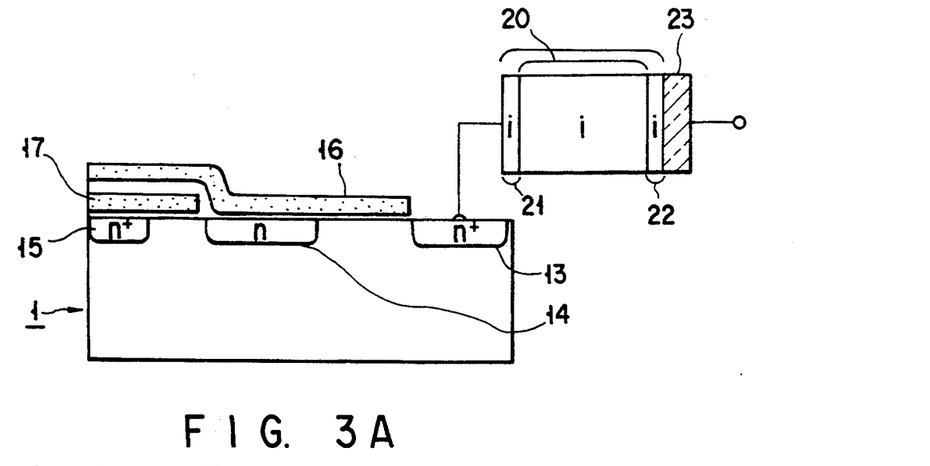
FIG. 3A is a schematic sectional view of an element according to an embodiment of the present invention.

The operation of the embodiment will be explained, referring to a schematic view in FIG. 3A and potential diagrams accompanied by band diagrams in FIGS. 3B through 3H.

Figure 3B:
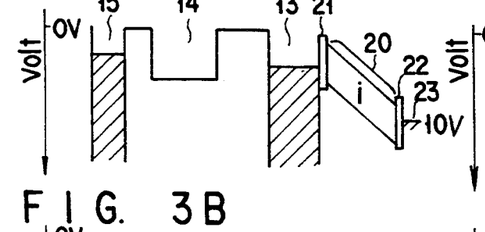
FIGS. 3B through 3H are potential diagrams for explaining the relationship between the operation of the element and the potential of the n-type region constituting a storage diode.
Figure 3C:
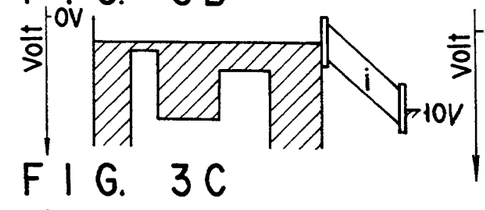

FIG. 3B shows a state immediately after the signal charge has been read from the n-type region 13 forming the storage diode. At this time, the potential of the transparent electrode 23 is set to, for example, 10 V. In this state, the charge inject gate and read-out gate are turned on as shown in FIG. 3C to allow charges to be injected from the charge inject drain 15 into the n-type region 13 of the storage diode. Then, as shown in FIG.

Figure 3D:
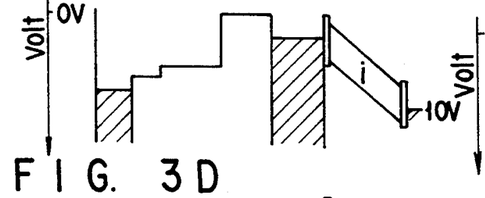
Figure 3E:
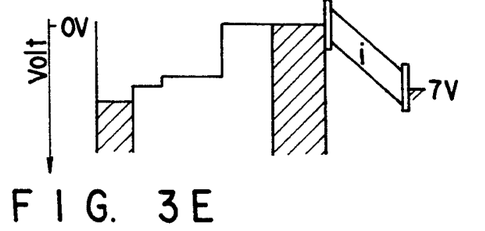

3D, the channel potential of the signal read-out gate 16 is set to 0 V, the potential of the element isolating region 12. Next, as shown in FIG. 3E, the potential of the transparent electrode 23 is dropped to, for example, 7 V to discharge part of charges from the n-type region 13 of the storage diode. This resets the potential of the n-type region of the storage diode to 0 V and at the same time, permits the remaining charges in the vertical CCD channel 14 to go out into the charge inject drain 15.

Figure 3F:
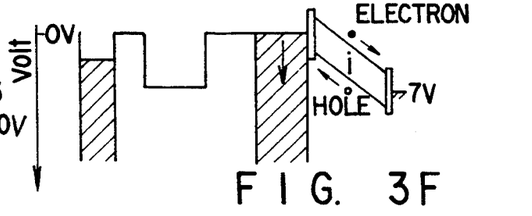
Figure 3G:
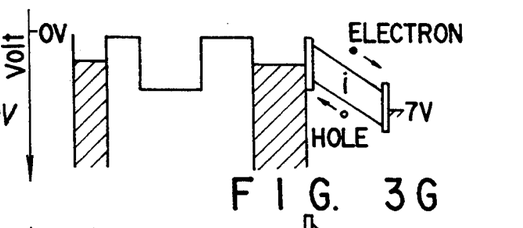

FIG. 3F shows a state immediately before the accumulation of the signal has been started. The potential of the transparent electrode 23 is set to approximately 7 V. When the accumulation of the signal is started, holes of the carriers generated in the photo-conductive film 20 according to the intensity of the incident light are injected into the storage diode 13. With this injection, the potential of the n-type region 13 forming the storage diode becomes higher as shown in FIG. 3G. When the potential of the transparent electrode is higher than that of the n-type region 13 forming the storage diode (that is, when the signal is accumulated), the junction of the photoelectric conversion layers is in a so-called reverse-biased state. Further, the potential of the n-type region 13 forming the storage diode is saturated at the potential applied to the transparent electrode 23 and never becomes higher than that. The channel potential of the signal read-out gate 16 is kept at 0 V.

Figure 3H:
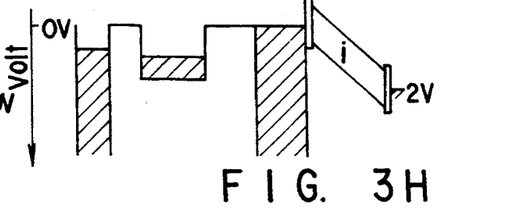

The reading of the signal into the vertical CCD channel 14 is done by, for example, dropping the potential of the transparent electrode 23 to 2 V with the channel potential of the signal read-out gate 16 set to 0 V as shown in FIG. 3H. In this case, the signal charge read from the n-type region 13 forming the storage diode is many when the amount of incident light is small, because the number of holes injected is also few, and is few when the amount of incident light is large, because the amount of holes injected is also many. That is, as holes are injected in proportion to the amount of incident light, the amount of the signal charges read from the n-type region 13 of the storage diode decreases accordingly. Specifically, in resetting the potential of the storage diode, the amount of charge obtained by subtracting the charge of holes generated by light from a specified amount of charge injected into each pixel is read from the storage diode into the CCD. By reversing the output of the element with a circuit (not shown) outside the element, a normal reproduced image is obtained.

By setting as described above, of a series of capacitors connected to the n-type region 13 of the storage diode, only the charges accumulated in the capacitor of the photo-conductive film 20 which has almost no variations over the entire pixel region are read. The signal charges can be prevented from mixing with each other going over the isolating region 12 in reading the signal, by setting the signal reading pulse applied to the transparent electrode 23 during the reading of the signal charge so that it may act as a triangular waveform that increases toward the negative side as time passes. After that, the signal charge accumulated in the vertical CCD channel 14 are transferred to the horizontal CCD 3.

With this configuration, when F.P.N. is liable to be conspicuous because the amount of incident light is small in carrying out the above operation, the potential of the n-type region 13 forming the storage diode has a value close to the potential of the element isolating region 12. As a result, the width of the depletion layer around the storage diode is narrow, thereby decreasing the value of dark current generated in the vicinity. Therefore, it is possible to realize an element with higher sensitivity and less F.P.N. during a dark time than those of conventional devices.

In this embodiment, immediately before the accumulation of the signal, or at the start of storing the signal, the potential of the n-type region 13 forming the storage diode is kept at a potential equal to that of the element isolating region 12. The potential, however, is not limited to the potential of the element isolating region 12, but may be set in the range up to a potential approximately 1.5 V higher than that of the element isolating region 12. This is because the value of dark current generated around the storage diode is sufficiently small when the potential of the n-type region 13 of the storage diode is in the range.

As described above, with the embodiment, immediately before the accumulation of the signal charge in the n-type region 13 of the storage diode 13, by injecting charges into the n-type region 13 of the storage diode to reset the potential of the storage diode to a value close to the potential of the element isolating region 12 and by injecting holes of the carriers generated in the photo-conductive film 20 into the storage diode, the generation of dark current can be effectively suppressed particularly in a case where the amount of incident light is small so that F.P.N. is conspicuous on the reproduction screen. As a result, a higher-sensitivity solid-state imaging device can be realized than conventional devices.

The present invention is not limited to the above embodiment. While in the embodiment, a case where the invention has been applied to the interline transfer (I.T.) type has been explained, the invention may be applied to an frame interline transfer (FIT) solid-state imaging device.

Figure 4A:
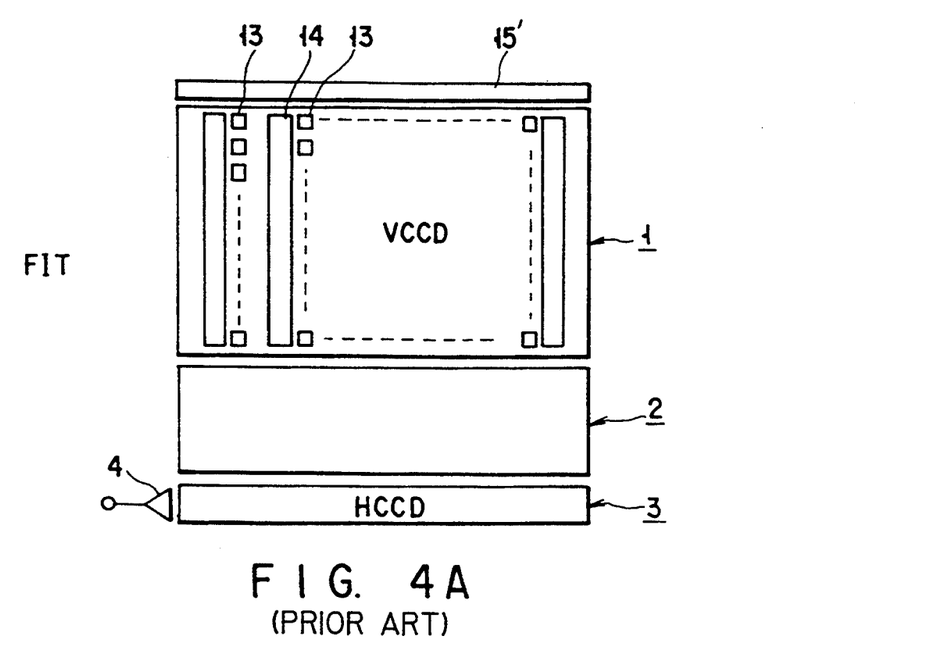
FIG. 4A is a schematic plan view of a conventional frame interline transfer (FIT) solid-state imaging device to which the present invention is applied.

Specifically, in a schematic plan view in FIG. 4A of a solid-state imaging device according to another embodiment of the present invention, a frame interline transfer (FIT) type is shown.

FIG. 4A is a plan view of the device. Specifically, the device is provided with a pixel region 1 containing storage diodes, signal reading portions, and signal transferring portions (i.e., vertical CCDs), a storage section (e.g., example, a memory section) 2, provided adjacent to the pixel region, for temporarily storing the signal charge transferred from the pixel region 1, and a horizontal CCD 3, provided adjacent to the storage section, for horizontally transferring the signal charge stored in the storage section 2. At one end of the horizontal CCD 3 is provided a sensing section 4 for supplying the signal charge transferred by the horizontal CCD 3.

Although in the previous embodiment, the potential of the storage diode is reset using the charge inject drain 15 (cf. FIG. 2) in the pixel region, the FIT device, however, enables the potential of the storage diode portion to be reset without providing the charge inject drain in the pixel region. Specifically, after the signal charge is read from the storage diode into the vertical CCD and transferred to the memory section, charges are injected into the storage diode portion via the vertical CCD from a drain provided at one end of the vertical CCD opposite the horizontal CCD. The surplus charge remaining in the vertical CCD may be discharged to the drain 15' at one end of the vertical CCD after the potential of the storage diode portion has been reset by the transparent electrode. This arrangement also realizes a solid-state imaging device of the present invention, as shown in FIG. 4B.

Figure 4B:
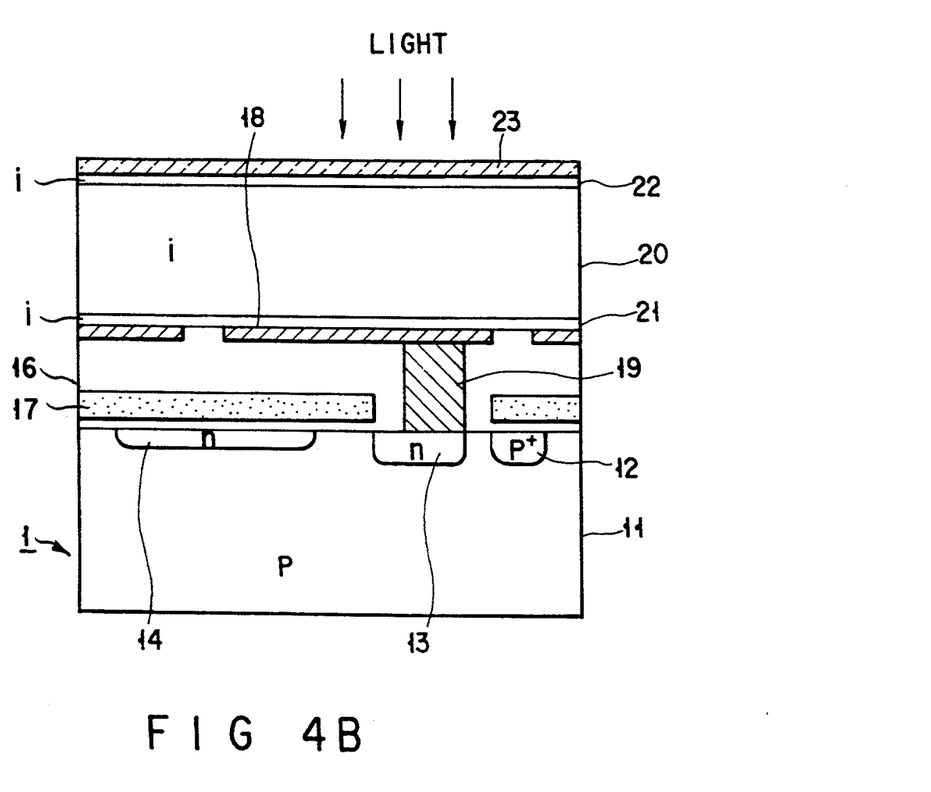
FIG. 4B is a detailed sectional view of an unit pixel in the device of FIG. 4A.

The difference between the construction of FIG. 4A and that of a conventional FIT or IT device is that the charge inject drain 15' of FIG. 4A is provided adjacent to the pixel region, in place of the charge inject drain 15 of FIG. 2 which is eliminated in FIG. 4B.

The present invention may be practiced or embodied in still other ways without departing from the spirit or character thereof.

While in the embodiments, the three-layer structure of the photo-conductive films consists of a combination of the i-type and the i-type and the i-type, other combinations are possible. That is, holes can be used as the input signal provided that the polarity of the junctions of the three-layer films is opposite. Therefore, for example, the electron injection blocking layer 21 may be of, the p type, the photoelectric conversion film 20 of the i-type, and the hole inject blocking layer 22 of the i-type. Further, the electron inject blocking layer 21 may be of the p-type, the photoelectric conversion film 20 of the i-type, and the hole inject block layer 22 of the n-type.

As described in detail, with the present invention, it is possible to provide a solid-state imaging device which can decrease the dark current generated around the storage diode and suppress F.P.N. during a dark time sufficiently when the amount of incident light is small so that F.P.N. is conspicuous particularly on the reproduction screen, which has been a problem with conventional devices, by resetting the potential of the storage diode to nearly the potential of the isolating region at the start of the accumulation of the signal and by injecting holes generated by the incident light in the photo-conductive film into the storage diode.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A solid-state imaging device comprising a semiconductor substrate in which a specific array of signal charge storage diode portions of one conductivity type and signal charge read-out portions are formed, a solid-state imaging element in which an element isolating region whose conductivity is opposite to that of the diode portions is formed between two of said storage diode portions and pixel electrodes being electrically connected to said storage diode portions are formed on the imaging element, a photoconductive film stacked above said solid-stage imaging element, and a transparent electrode formed above said photoconductive film, wherein:

a drain for charge injection is further formed in aid semiconductor substrate; and by injecting a specified amount of charge from said drain into a specified region forming said storage diode portion, the potential of a specified region forming each of said storage diode portions is set to a value equal to or higher than the potential of said element isolating region immediately before the accumulation of the signal charge in said specified region forming said storage diode portions; and during the accumulation of the signal charge, the potential applied to said transparent electrode is set to a value higher than the potential of said storage diode portion set immediately before the accumulation of the signal charge.

2. The solid-stage imaging device according to claim 1, wherein said pixel electrodes have a three-layer structure thereon of an electron injection blocking layer, a photoelectric conversion means including a photoelectric conversion film, and a hole injection blocking layer stacked in that order.

3. The solid-state imaging device according to claim 2, wherein said pixel electrodes have an electron injection blocking layer, a photoelectric conversion film, and a hole injection blocking layer stacked in that order on said pixel electrodes;

said electron injection blocking layer and said hole injection blocking layer are both of the i-type amorphous silicon carbide (a-SiC); and said photoelectric conversion film is made of amorphous silicon (a-Si).

4. The solid-state imaging device according to claim 2, wherein said electron injection blocking layer is of the p-type, said photoelectric conversion film is of the i-type, and said hole injection blocking layer is of the i-type.

5. The solid-state imaging device according to claim 2, wherein said electron injection blocking layer is of the p-type, said photoelectric conversion film is of the i-type, and said hole injection blocking layer is of the n-type.

6. A solid-state imaging device comprising a p-type silicon (Si) substrate in which n-type storage diode portions, signal read-out portions, n-type Charge-Coupled Device (CCD) channels, and p+-type element isolating regions are formed, a solid-state imaging element on a top of said substrate in which pixel electrodes are formed, a photo-conductive film stacked above said solid-state imaging element, and a transparent electrode formed above said photo-conductive film, wherein:

a drain for charge injection is provided on said substrate;

the potential of said storage diode portion is set to a value almost equal to the potential of said element isolating region immediately before the accumulation of the signal charge, by injecting a specified amount of charge from said drain into a specified region forming said storage diode portion; and during the accumulation of the signal charge, the potential applied to said transparent electrode is set to a value higher than the potential of said storage diode portion set immediately before the accumulation of the signal charge, and as a result of injecting holes, not electrons, of the carriers generated by the incident light in said photo-conductive film into said storage diode portion, the injected holes and electrons stored in the storage diode portion cancel out one another, thereby allowing the potential of said storage diode portion to change from a value close to the potential of an element isolating layer and said substrate in the vicinity to a higher potential as the signal is accumulated.

7. The solid-state imaging device according to claim 6, wherein the potential of said storage diode portion, as the signal is accumulated, changes from a value close to the potential of said element isolating layer and said substrate in the vicinity to a higher potential, by making use of the action of injecting holes, not electrons, of the carriers generated by the incident light in said photoconductive film into said storage diode portion to allow the injected holes to cancel out as many electrons.

8. A solid-state imaging device comprising an element containing a p-type silicon (Si) substrate, and $p^+$-type element isolating regions, storage diode portions made up of n-type impurity diffused regions, and vertical Charge-Coupled Device (CCD) buried transfer channels made up of n-type impurity diffused regions, and charge inject drains for injecting charges in said storage diode portions to set a potential all formed at least at one surface of said substrate, wherein:

a signal read-out gate also serving as a charge transfer electrode and a charge inject gate are formed in a layer above said charge inject drain with an interlayer insulating means intervening, and a pixel electrode is further formed in a layer above an underlying layer with an interlayer insulating means intervening;

said pixel electrode is connected by a lead electrode to said storage diode portion;

said charge inject drain injects a predetermined amount of charge into said storage diode portion to set the value of the potential of said storage diode portion, and then, holes, not electrons, generated by the incident light are injected into said storage diode portion and the difference between a specified amount of charge injected and the charge of said holes generated by the incident light is used as an output signal.

9. The solid-state imaging device according to claim 8, further comprising: a solid-state imaging element with a photoelectric conversion means formed thereon for converting the incident light into a corresponding charge; and on said photoelectric conversion film, a transparent electrode made of ITO (Indium Tin Oxide) is formed.

10. The solid-stage imaging device according to claim 9, wherein said photoelectric conversion means is photoelectric conversion film made of hydrogenated amorphous silicon (a-Si:H), and a hole injection blocking layer made of a material whose band gap energy is greater than that of hydrogenated amorphous silicon (a-Si:H) are formed between said photoelectric conversion film and said transparent electrode, and electron injection blocking layer made of a material whose band gap energy is greater than that of hydrogenated amorphous silicon are formed between said photoelectric conversion film and said solid-stage imaging element.

11. The solid-state imaging device according to claim 9, wherein an electron injection blocking layer made of hydrogenated amorphous silicon carbide (a-SiC:H) is formed between said photoelectric conversion film and said solid-state imaging element.

12. The solid-state imaging device according to claim 9, wherein a hole injection blocking layer made of hydrogenated amorphous silicon carbide (a-SiC:H) is formed between said photoelectric conversion film and said transparent electrode.

* * * * *